United States Patent
Kaynak et al.

(10) Patent No.: US 11,429,309 B2
(45) Date of Patent: *Aug. 30, 2022

(54) ADJUSTING A PARAMETER FOR A PROGRAMMING OPERATION BASED ON THE TEMPERATURE OF A MEMORY SYSTEM

(71) Applicant: Micron Technology, Inc., Boise, ID (US)

(72) Inventors: Mustafa N Kaynak, San Diego, CA (US); Sampath K Ratnam, Boise, ID (US); Zixiang Loh, Folsom, CA (US); Nagendra Prasad Ganesh Rao, Folsom, CA (US); Larry K Koudele, Erie, CO (US); Vamsi Pavan Rayaprolu, San Jose, CA (US); Patrick R Khayat, San Diego, CA (US); Shane Nowell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/930,064

(22) Filed: Jul. 15, 2020

(65) Prior Publication Data
US 2020/0348881 A1 Nov. 5, 2020

Related U.S. Application Data

(63) Continuation of application No. 15/913,168, filed on Mar. 6, 2018, now Pat. No. 10,732,890.

(51) Int. Cl.
*G06F 3/06* (2006.01)
*G06F 11/07* (2006.01)

(52) U.S. Cl.
CPC .......... *G06F 3/0653* (2013.01); *G06F 3/0619* (2013.01); *G06F 3/0634* (2013.01);
(Continued)

(58) Field of Classification Search
CPC .... G06F 3/0653; G06F 3/0619; G06F 3/0634; G06F 3/0659; G06F 3/0679; G06F 11/07;
(Continued)

(56) References Cited

U.S. PATENT DOCUMENTS

| | | | |
|---|---|---|---|
| 9,183,070 B2* | 11/2015 | Marquart | G06F 11/1048 |
| 10,732,890 B2* | 8/2020 | Kaynak | G06F 11/073 |
| 2008/0068873 A1* | 3/2008 | Matsuno | G11C 11/221 365/145 |
| 2009/0091979 A1* | 4/2009 | Shalvi | G11C 11/5642 365/185.09 |

(Continued)

OTHER PUBLICATIONS

PCT International Search Report and Written Opinion for International Application No. PCT/US2019/021039 dated Jun. 19, 2019, 10 pages.
(Continued)

*Primary Examiner* — Kamini B Patel
(74) *Attorney, Agent, or Firm* — Lowenstein Sandler LLP

(57) ABSTRACT

A processing device, operatively coupled with a memory device, is configured to identify a temperature related to a memory device of a plurality of memory devices; to determine whether the temperature satisfies a threshold temperature condition; responsive to detecting that the temperature related to the memory device satisfies the threshold temperature condition, to identify an entry associated with the memory device from a plurality of entries in a data structure, wherein each entry of the plurality of entries corresponds to one of the plurality of memory devices; to determine a parameter value associated with the memory device from the entry, wherein the parameter value is for a programming operation to store data at the memory device; to adjust the parameter value associated with the memory device to (Continued)

generate an adjusted parameter value; and to store the adjusted parameter value in the entry of the data structure.

18 Claims, 6 Drawing Sheets

(52) U.S. Cl.
CPC .......... *G06F 3/0659* (2013.01); *G06F 3/0679* (2013.01); *G06F 11/073* (2013.01); *G06F 11/076* (2013.01)

(58) Field of Classification Search
CPC .... G06F 11/073; G06F 11/079; G06F 11/076; G06F 11/0727; G06F 11/10; G06F 11/1048
See application file for complete search history.

(56) References Cited

U.S. PATENT DOCUMENTS

| | | | |
|---|---|---|---|
| 2013/0080679 A1* | 3/2013 | Bert | G06F 12/0866 711/102 |
| 2014/0226412 A1* | 8/2014 | Yeh | G11C 29/028 365/185.21 |
| 2016/0203863 A1* | 7/2016 | Chien | G06F 11/076 714/704 |
| 2016/0239235 A1* | 8/2016 | Chung | G11C 16/28 |
| 2017/0200492 A1* | 7/2017 | Yang | G11C 11/5642 |
| 2017/0345510 A1* | 11/2017 | Achtenberg | G11C 29/52 |
| 2018/0277173 A1* | 9/2018 | Takizawa | G11C 16/10 |
| 2019/0278510 A1* | 9/2019 | Kaynak | G06F 3/0634 |
| 2020/0348881 A1* | 11/2020 | Kaynak | G06F 3/0619 |

OTHER PUBLICATIONS

Extended European Search Report Serial No. EP 19 76 3489, dated Nov. 1, 2021, 9 pages.

* cited by examiner

US 11,429,309 B2

ADJUSTING A PARAMETER FOR A PROGRAMMING OPERATION BASED ON THE TEMPERATURE OF A MEMORY SYSTEM

RELATED APPLICATIONS

This application is a continuation application of co-pending U.S. patent application Ser. No. 15/913,168, filed Mar. 6, 2018, which is incorporated by reference herein.

TECHNICAL FIELD

Embodiments of the disclosure relate generally to memory systems, and more specifically, relate to adjusting a parameter for a programming operation based on temperature of a memory system.

BACKGROUND

A memory system can be a storage system, such as a solid-state drive (SSD), and can include one or more memory components that store data. For example, a memory system can include memory devices such as non-volatile memory devices and volatile memory devices. The memory system can further include a controller that can manage each of the memory devices and allocate data to be stored at the memory devices. A host system can utilize the memory system and request data from the memory system. The controller can be used to retrieve data from the corresponding memory devices and return the retrieved data to the host system.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
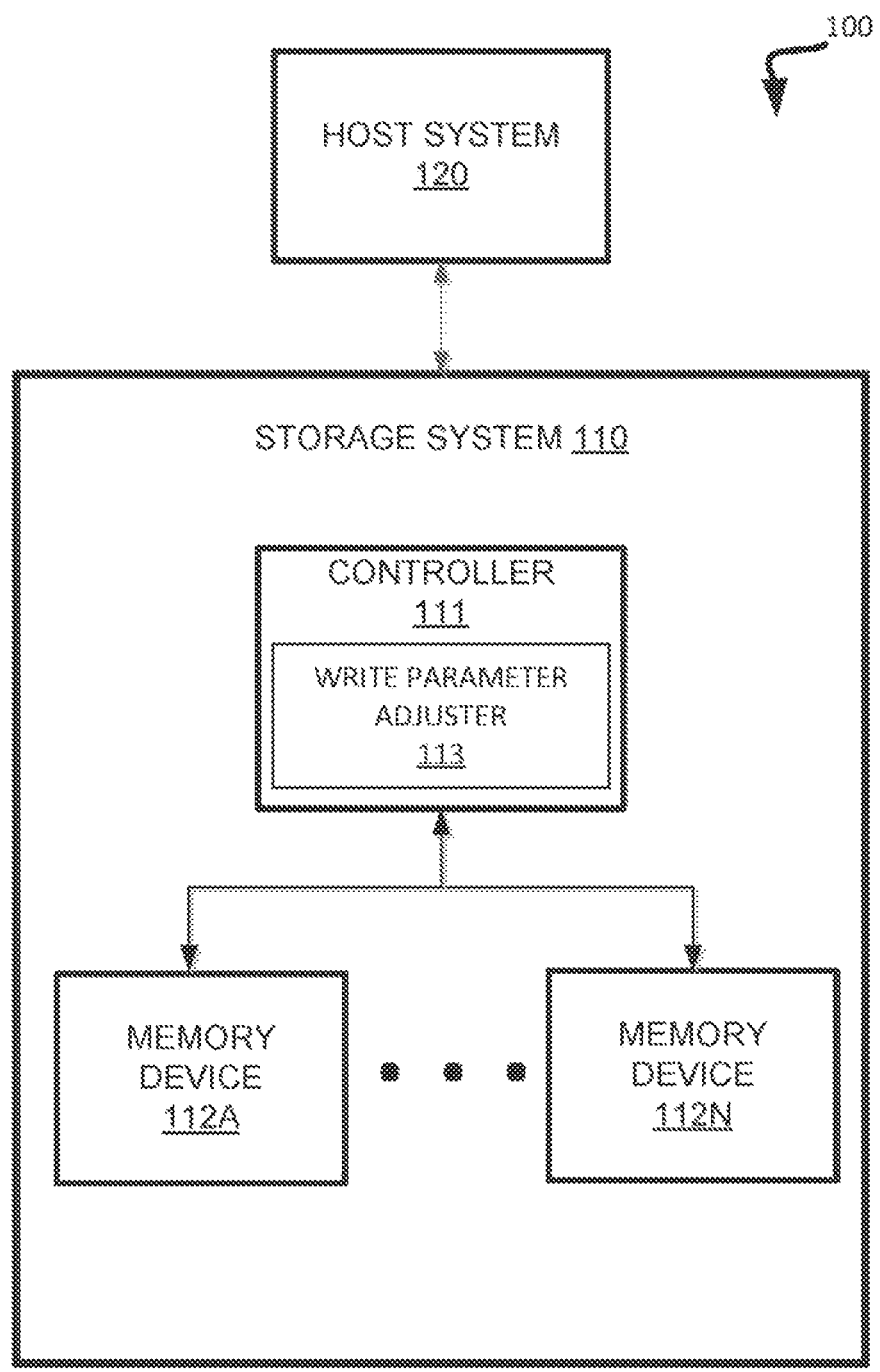
FIG. 1 illustrates an example computing environment that includes a storage system in accordance with some embodiments of the present disclosure.

Aspects of the present disclosure are directed to adjusting a parameter for a programming operation based on a temperature of a memory system. An example of a memory system is a storage system, such as a solid-state drive (SSD). In some embodiments, the memory system is a hybrid memory/storage system. A storage system is used as an example of a memory system throughout this document. In general, a host system can utilize a storage system that includes one or more memory devices. The memory devices can include non-volatile memory devices, such as, for example, negative-and (NAND). The host system can provide data to be stored at the storage system. The data can be stored at and retrieved from memory devices within the storage system. The memory devices of the storage system can include memory cells that are used to store data from the host system.

Each memory cell can store data values as a threshold voltage for that particular memory cell. In one example, the memory devices of the storage system can include a single-level-cell (SLC) memory where each memory cell of the SLC memory can be programmed with a single bit of data. When storing one bit of data in the SLC memory, a range of possible threshold voltages of a memory cell is divided into two ranges. For example, the two ranges can include a first threshold voltage range that corresponds to the logical data value "1" and a second threshold voltage range that corresponds to the logical data value "0."

Some storage systems can include higher density memory devices such as multi-level-cell (MLC) memory that is programmed by storing 2 bits per memory cell, 3 bits per memory cell, 4 bits per memory cell, or more bits per memory cell. Data can be stored at an MLC memory based on a total threshold voltage range that is divided into distinct threshold voltage ranges for the memory cells. Each distinct threshold voltage range corresponds to a predetermined value for the data stored at the memory cell.

In the case of storing multiple bits of data at a single memory cell, the total threshold voltage range for the memory cell is divided into the distinct threshold voltage ranges corresponding to the number of levels of data (e.g., possible values of the data). For example, if four levels of data are stored at a single memory cell, then the total threshold voltage range for the single memory cell can be divided into four threshold voltage ranges that are separately assigned to the logical data values "11", "10", "01", and "00."

Conventional storage systems can store multiple bits of data in a single memory cell by mapping sequences of bits of the data to the different threshold voltage ranges of the memory cell. For example, a particular logical data value '11') can be assigned to a threshold voltage range and another logical data value (e.g., '10') can be assigned to another threshold voltage range of the memory cell. The data can be stored into the memory cell by using a programming operation that applies a sequence of programming pulses to the memory cell. The sequence of programming pulses can be applied to the memory cell until a voltage level within a corresponding threshold voltage range has been reached at the memory cell. After the memory, cell has been programmed, data can be read from the memory cell by applying a read threshold voltage to the memory cell at the corresponding threshold voltage range and translating the programmed voltage level at the memory cell.

The storage system can be operated in an environment with varying temperature extremes (e.g., between 0 to 70 degrees Celsius (° C.)). In such cases, the integrity of the data stored in the memory cells can be adversely affected. For example, the voltage level associated with a memory cell can shift from being detected at a particular read threshold voltage as the temperature of the storage system changes. This results in increased raw bit error rate (RBER) which can be beyond the error correction capability of the underlying error correction code (ECC). This can be problematic when translating voltages into data values that correspond to the various threshold voltage (Vt) ranges of the memory cell. As the temperature decreases to a certain level (e.g., to 0° C.), threshold voltage distributions widen and shifts resulting in increased RBER and this consequently results in an incorrect voltage level association with the memory cells.

Embodiments of the disclosure address the above and other deficiencies by reducing a programming step size (e.g., the amount that the voltage value is increased between each of the successive programming pulses) from a default programming step size when the temperature of the storage system has dropped below a threshold level. The programming step size is a parameter used to perform a programming operation. For example, the storage system can program data to the memory cells by using a sequence of programming pulses using a particular programming step size. The storage system can use a default programming step size (e.g., an initial voltage value) when the storage system is at an initial temperature range (e.g., an average room temperature). Smaller programming step size results in finer placement of voltage distributions (i.e., tighter Vt distributions) and hence lower RBER.

When the storage system detects that a lower temperature range is present, the storage system can reduce the speed of the programming of memory cells by reducing the programming step size from its default value to an updated value. The updated value can specify a lower programming step size (e.g., a smaller increase in the voltage value between successive programming pulses). This allows the storage system to reduce the effects of an extreme temperature change by slowing down the programming of the memory cells resulting in tighter Vt distributions. When the storage system returns to the initial temperature range, the storage system speeds up programming of the memory cells by reverting the programming step size from the updated value to the initial value.

In some implementations, the storage system can adjust the programming step size when the temperature decreases further based on a characterization (e.g., error rate) of storage system. For example, by decreasing the programming step size from the default value to the updated value, the number of programming pulses to program a memory cell increases. Because of the reduction in programming step size, the read budget window (RWB) (which represents the sum of edge margins between adjustment threshold states) can increase, e.g., an increase in margin between different threshold voltage ranges, which means the storage system encounters fewer read errors. In this way, the storage system gains back the some or the entire margin in the RWB that is lost when the temperature drops to a certain level (e.g., to 0° C.). When the programming step size is reduced, a programming time to program a memory cell increases as additional programming pulses are used to program the memory cell. As a result of programming performance loss, the smaller step size is only used when temperature goes below a threshold. If programming step size is reduced too much, due to increase in programming time some low voltage cells might experience increased program disturb resulting in higher RBER. Therefore, caution needs to be exercised while reducing programming step size.

FIG. 1 illustrates an example computing environment 100 that includes a memory system in accordance with some implementations of the present disclosure. The memory system can include media, such as memory devices 112A to 112N. The memory devices 112A to 112N can be volatile memory devices, non-volatile memory devices, or a combination of such. In some embodiments, the memory system is a storage system (e.g., storage system 110). An example of a storage system 110 is a solid-state drive (SSD). In general, the computing environment 100 can include a host system 120 that uses the storage system 110. In some implementations, the host system 120 can write data to the storage system 110 and read data from the storage system 110. In some embodiments, the memory system is a hybrid memory/storage system.

The host system 120 can be a computing device such as a desktop computer, laptop computer, network server, mobile device, or such computing device that includes a memory and a processing device. The host system 120 can include or be coupled to the storage system 110 so that the host system 120 can read data from or write data to the storage system 110. The host system 120 can be coupled to the storage system 110 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the storage system 110. The host system 120 can further utilize an NVM Express (NVMe) interface to access the memory devices 112A to 112N when the storage system 110 is coupled with the host system 120 by the PCIe interface. The physical host interface can provide an interface for passing control, address, data, and other signals between the storage system 110 and the host system 120.

As shown in FIG. 1, the storage system 110 can include a controller 111 and memory devices 112A to 112N. The memory devices 112A to 112N can include any combination of the different types of non-volatile memory devices and/or volatile memory devices. An example of non-volatile memory devices includes a negative-and (NAND) type flash memory. Each of the memory devices 112A to 112N can include one or more arrays of memory cells such as single level cells (SLCs) or multi-level cells (MLCs) (e.g., triple level cells (TLCs) or quad-level cells (QLCs)). In some implementations, a particular memory device can include both an SLC portion and a MLC portion of memory cells. Each of the memory cells can store bits of data (e.g., data blocks) used by the host system 120. Although non-volatile memory devices such as NAND type flash memory are described, the memory devices 112A to 112N can be based on any other type of memory such as a volatile memory. In some implementations, the memory devices 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memories, cross point non-volatile memory can perform a write in-place operation, where a non-volatile memory cell can be programmed without the non-volatile memory cell being previously erased. Furthermore, the memory cells of the memory devices 112A to 112N can be grouped as memory pages or data blocks that can refer to a unit of the memory device used to store data.

The controller 111 can communicate with the memory devices 112A to 112N to perform operations such as reading data, writing data, or erasing data at the memory devices 112A to 112N and other such operations. The controller 111 can include hardware such as one or more integrated circuits and/or discrete components, a processing device, a buffer memory, software such as firmware or other instructions, or a combination thereof. In general, the controller 111 can receive commands or operations from the host system 120 and can convert the commands or operations into instructions or appropriate commands to achieve the desired access to the memory devices 112A to 112N. The controller 111 can be responsible for other operations such as wear leveling operations, garbage collection operations, error detection and error-correcting code (ECC) operations, encryption operations, caching operations, and address translations between a logical block address and a physical block address that are associated with the memory devices 112A to 112N. The controller 111 can further include host interface circuitry to communicate with the host system 120 via the physical host interface. The host interface circuitry can convert the commands received from the host system into command instructions to access the memory devices 112A to 112N as well as convert responses associated with the memory devices 112A to 112N into information for the host system 120.

The storage system 110 can include a write parameter adjuster 113 (e.g., circuitry, dedicated logic, programmable logic, firmware, etc.) to perform the operations described herein. In some embodiments, the controller 111 includes at least a portion of the programming component 113. The write parameter adjuster 113 can be used to adjust write parameters (e.g., programming step size) for programming data received from the host system 120 to the memory device 112A to 112N. As the data from the host system 120 is received to be stored at the storage system, the write parameter adjuster 113 can detect that a temperature of the computing environment 100 has dropped below a certain threshold level.

Upon receiving an indication of the temperature being below the threshold level, the write parameter adjuster 113 can reduce the programming step size that is used to program data at the memory cell programming. For example, the write parameter adjuster 113 can decrease the programming step size from a first default value to a second value. Once the operating temperature of the computing environment 100 returns to over the threshold level, the write parameter adjuster 113 reverts back to performing the programming of data at the memory cell with the programming step size at the first default value. Further details with regards to the operations of the write parameter adjuster 113 are described below.

The storage system 110 can also include additional circuitry or components that are not illustrated. For example, the storage system 110 can include a cache or buffer (e.g., DRAM) and address circuitry (e.g., a row decoder and a column decoder) that can receive an address from the controller 111 and decode the address to access the memory devices 112A to 112N.

Figure 2:
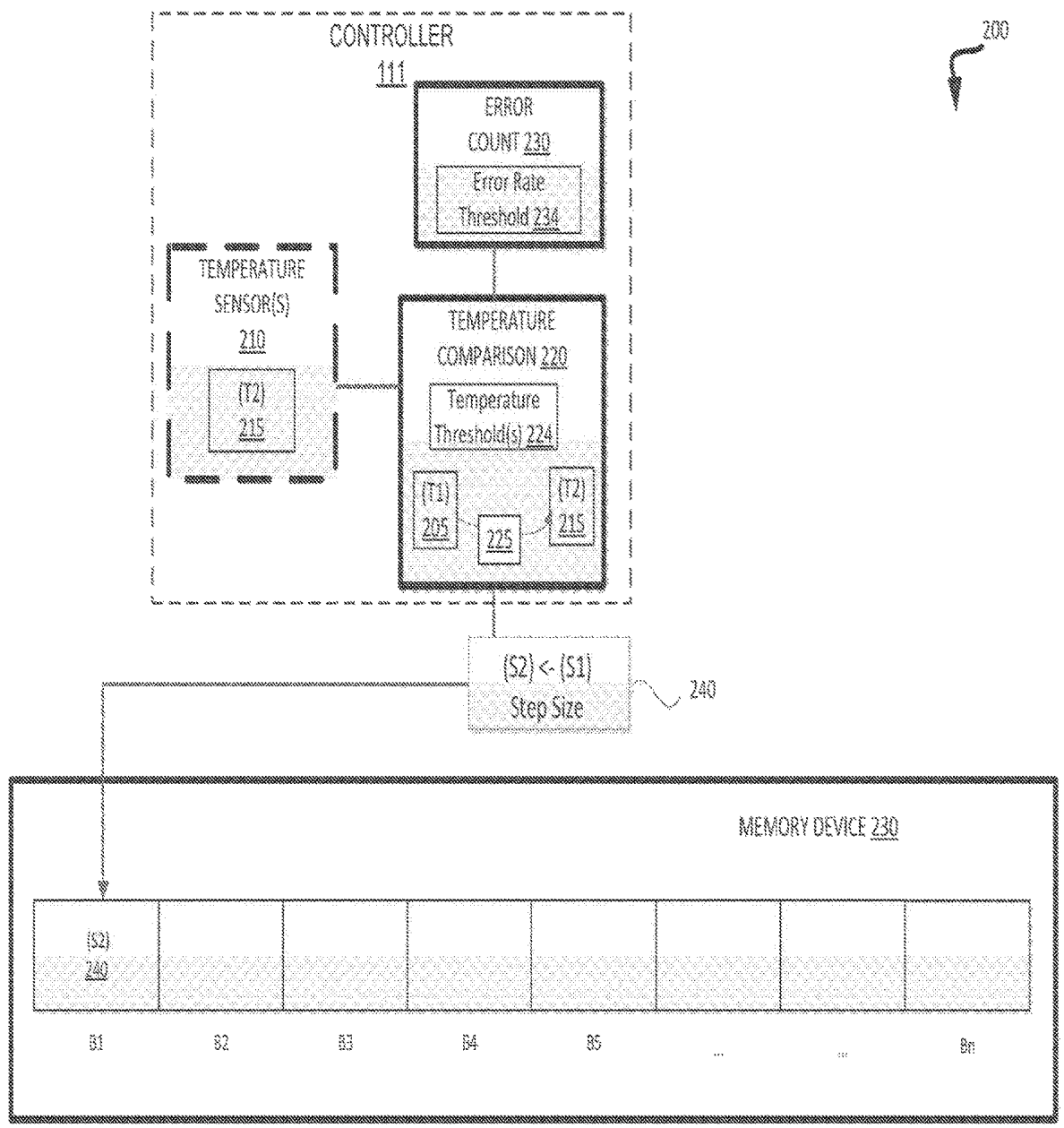
FIG. 2 illustrates a storage system that adjusts a parameter for a programming operation based on a temperature in accordance with some embodiments of the present disclosure.

FIG. 2 illustrates a storage system 200 to adjust a parameter based on a temperature in accordance with some embodiments of the present disclosure. In general, the storage system 200 can correspond to the storage system 110 of FIG. 1. For example, the storage system 200 can include controller 111 of FIG. 1. In some implementations, the controller 111 can be configured to retrieve temperature measurements associated with the memory device 230. The controller 111 can be configured to adjust a programming step size (i.e., a parameter) for programming operations on the memory device 230 based on the temperature measurements.

As shown, the memory device 230 can be organized into one or more blocks B1-n. The blocks B1-n each include multiple memory pages that can correspond to portions of the memory device 230. The size and configuration of the blocks B1-n can vary. For example, each of the blocks B1-n can include any number of memory pages, and each memory page can have an associated storage capacity for storing data.

Data can be programmed, read, and/or erased from the memory pages of the blocks B1-n. In some implementations, the memory pages can correspond to a group of memory cells that are read and/or programmed together. The memory cells can be programmed using an iterative programming process. In this type of process, a sequence of programming pulses is applied to a group of memory cells until the desired voltage levels in the memory cells is reached. Once the memory cells have been programmed, data can be read from the memory cells by translating the programmed voltage level of the memory cells.

In some implementations, the controller 111 can determine whether the storage system 200 is operating within a certain temperature range. For example, the controller 111 can detect a change in temperature beyond a threshold level. Temperature information for the storage system 200 can be obtained when programming the memory device 230 and used to adjust certain programming operations. In response to detecting that there is a change in the temperature, the controller 111 can adjust certain write parameters (e.g., programming step size) for programming data to the memory cells of memory device 230.

Temperature information associated with the memory device 230 can be obtained in several ways. For example, the temperature information can include temperature measurements T2 215 from one or more temperature sensors 210 located in and around memory device 230 and/or temperature measurements from other temperature sensors that are associated with other components of system 200 (e.g., controller 111). The controller 111 can obtain temperature measurements T2 215 from the sensors 210 to determine whether the storage system 200 is operating within a permissible temperature range T1 205. In some implementations, the temperature sensors 210 can be configured to measure a temperature 215 and to provide an indication of the measured temperature 215 to the controller 111. In other implementations, the temperature sensors 210 can be responsive to one or more commands that can be sent by the controller 111, such as a command to measure temperature 215.

The controller 111 can also include temperature comparison operation 240 to determine whether the storage system 200 is operating at a temperature below a threshold temperature level (e.g., at or below 0° C.). For example, the temperature comparison operation 240 can compare a first (preset) temperature 205 associated with the memory device 230 to a current or second temperature 215 reading from the sensor 210. The first temperature 205 can be a preset temperature specification for the storage system 200. The preset temperature specification can indicate a range of optimal temperatures for the storage system 200. The second temperature 215 can be related to a time in which data is to be programmed to the memory device 230.

To compare the two temperatures, the temperature comparison operation 240 can determine a difference 225 between the first temperature 205 and the second temperature 215. The difference 225 can indicate whether there is a shift in the operating temperature of storage system 200. For example, the difference 225 can indicate a decrease in temperature associated with the memory device 230 that is the storage system 200 (e.g., the temperature dropping from 70° C. to 0° C.). In some implementations, the difference 225 can indicate an increase in temperature associated with the memory device 230 (e.g., the temperature returning from 0° C. to 70° C.).

Upon detecting a change in temperature, the controller 111 determines whether the difference 225 satisfies a temperature threshold 224. In some implementations, temperature threshold 224 can be represented by a temperature threshold range for adjusting the programming step size 240. For example, the temperature threshold range can include a first threshold that indicates a lower boundary to a first temperature range. This first temperature range can correspond to an "optimal" temperature range, such as typical room temperature. The temperature threshold range can also include a second threshold corresponding to an "extreme" temperature range of temperatures that fall below a lowest temperature of the first temperature range.

If the temperature change satisfies temperature threshold 224, the controller 111 can slow down programming of data to the memory device 230 by adjusting a write parameter. For example, when the change in temperature satisfies the temperature threshold 224, a size of the programming step used to write data to the block B1 can be decreased from the first programming step size S1 to the second programming step size S2. To illustrate, the controller 111 can adjust the programming step size from a first value (e.g., the first programming step size S1) to a second value (e.g., the second programming step size S2) at least partially based on the temperature threshold 224.

To adjust the programming step size 240, the controller can select the second value from a data structure, such as a table, of programming step sizes. For example, the difference 225 in temperature change can be used as an index to retrieve the second value from the data structure. The data structure provides a level of granularity for decreasing the programming step size 240 as the temperature drops through several lower temperature ranges. For example, if the temperature drops 35° C., a particular second programming step size S2 can be selected. If the temperature drops another 35° C., a different lower programming step size can be selected. In other implementations, the second programming step size can be stored as a fixed value to subtract from the current programming step size S2 when the temperature change satisfies the temperature threshold 224.

By decreasing the programming step size 240 from a first value (e.g., the first programming step size S1) to a second value (e.g., the second programming step size S2) for programming data to a block B1 of memory device 230, the number of programming steps, and thus the programming time can increase. Due to the smaller programming step size that is used to program the memory cells of the memory device 230, the data programmed to the block B1 can encounter reduced errors. This is because the smaller programming step size is a finer placement of levels which results in tighter Vt distributions and hence the reduced error rate. In some situations, however, the repeated application of programming pulses due to the smaller programming step size can increase the error rate due to increased programming time causing higher program disturb resulting in a higher raw-bit-error-rate (RBER).

In some implementations, the controller 111 in conjunction with the temperature change can further determine an amount to update the programming step size based partially on an error rate of the memory device satisfying an error threshold rate. During the indicated low temperature operating condition when a reduced programming step size is used to program data, the controller 111 can also read data corresponding to the block B1. The controller 111 can determine an error count 230 based on the read data and can compare that error count 230 to the error rate threshold 234. If the error count 230 satisfies the error rate threshold 234, (e.g., the block error count 230 is below the error rate threshold 234), then the programming step size 240 can be adjusted without adversely impacting the memory device 230.

If the error count 230 is greater than the error rate threshold 234, then the likelihood of errors from the read data being caused by the adjustment to the programming step size can increase. Thus, the adjustment of the programming step size 240 to the second programming step size S2 is rejected by the controller 111 due to the impact to the memory device 230. Otherwise, the controller 111 can send the second programming step size S2 to the memory device 230 for use during a next programming operation to store data at the block B1.

Once the operating temperature returns to the prior temperature range (e.g., above the threshold temperature level), the controller 111 can return the programming step size to the initial default value S1. For example, the controller 111 determines whether the current temperature T1 205 from sensor 210 is within a range that corresponds to a preferred temperature range (e.g., approximately room temperature). As a result, the controller 111 can increase the rate of the programming of data to the memory device 230 by adjusting the programming step size. For example, the controller 111 can increase the programming step size 340 from the second programming step size S2 to the first programming step size S1. The controller 111 can then provide the programming step size 240 to the memory device 230 for use during the next programming or write operation.

Figure 3:
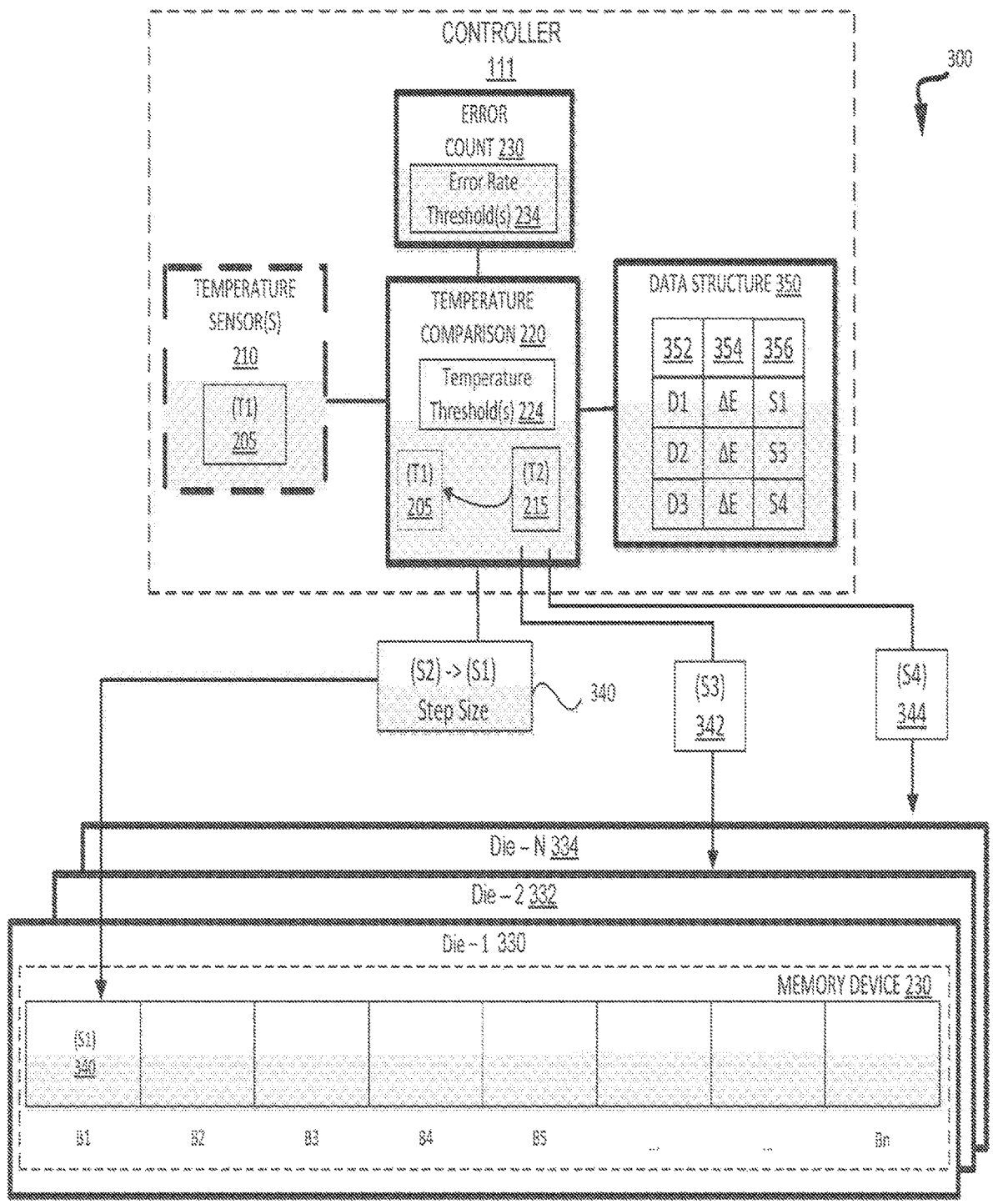
FIG. 3 illustrates another view of the storage system in accordance with some embodiments of the present disclosure.

FIG. 3 illustrates another view 300 of the storage system 200 of FIG. 2 in accordance with some embodiments of the present disclosure. In this example, the storage system 200 can include one or more dies 330, 332 and 334 coupled to controller 111. A die is a small block of semiconducting material on which functional circuits are fabricated. Each die may include a separate memory device organized into multiple memory blocks. As shown, memory die 330 includes memory device 230 which includes one or more of data blocks B1-n. Although programming step size can be the same for all the data stored on a particular memory die, the techniques disclosed herein can be used to dynamically program the programming step size for each memory die based on the temperature change and a characterization of the respective memory die. For example, the techniques can be used to track die-to-die variability in which each die starts with a different initial (or default) programming step size.

Then, due to a temperature change, the programming step sizes are decreased a fixed value from their respective default values.

To track the die-to-die variability for each die, the controller can generate and manage a data structure such as a data structure 350, such as a table. The data structure 350 can include a number of entries for each memory device where each of the entries includes information associated with the fields 352, 354, and 356. For example, the data structure 350 can include a first field 352 to identity a particular die, a second field 354 to identity an error count of the memory device associated with the die, and a third field 356 to identify the programming step size associated with the die. During the indicated low temperature operation, the controller 111 can read data corresponding to the memory device of the die and determine an error count 230 based on the read data. Thereupon, the controller 111 can store the error count 230 for that particular die in its corresponding field 354 of the data structure 350.

Using the data structure 350, the controller 111 can adjust the programming step size or write parameters for each die. For example, in response to a change in temperature, the controller 111 can read data from the data structure 350 corresponding to each die. The controller 111 can identify error rate 354 for the die and compare the error rate 354 to the error rate threshold 234. If the error rate 354 satisfies the error rate threshold 234, (e.g., the error rate 354 is below the threshold 234), the controller 111 can provide the programming step size adjustments 340, 342, and 344 to the corresponding memory devices 230, 332, and 334 for use during a next programming operation. For example, in response to an increase in temperature, the controller 111 can decrease the programming step size for die 332 a fixed value 342 and die 334 a fixed value 344 from their respective default values.

Figure 4:
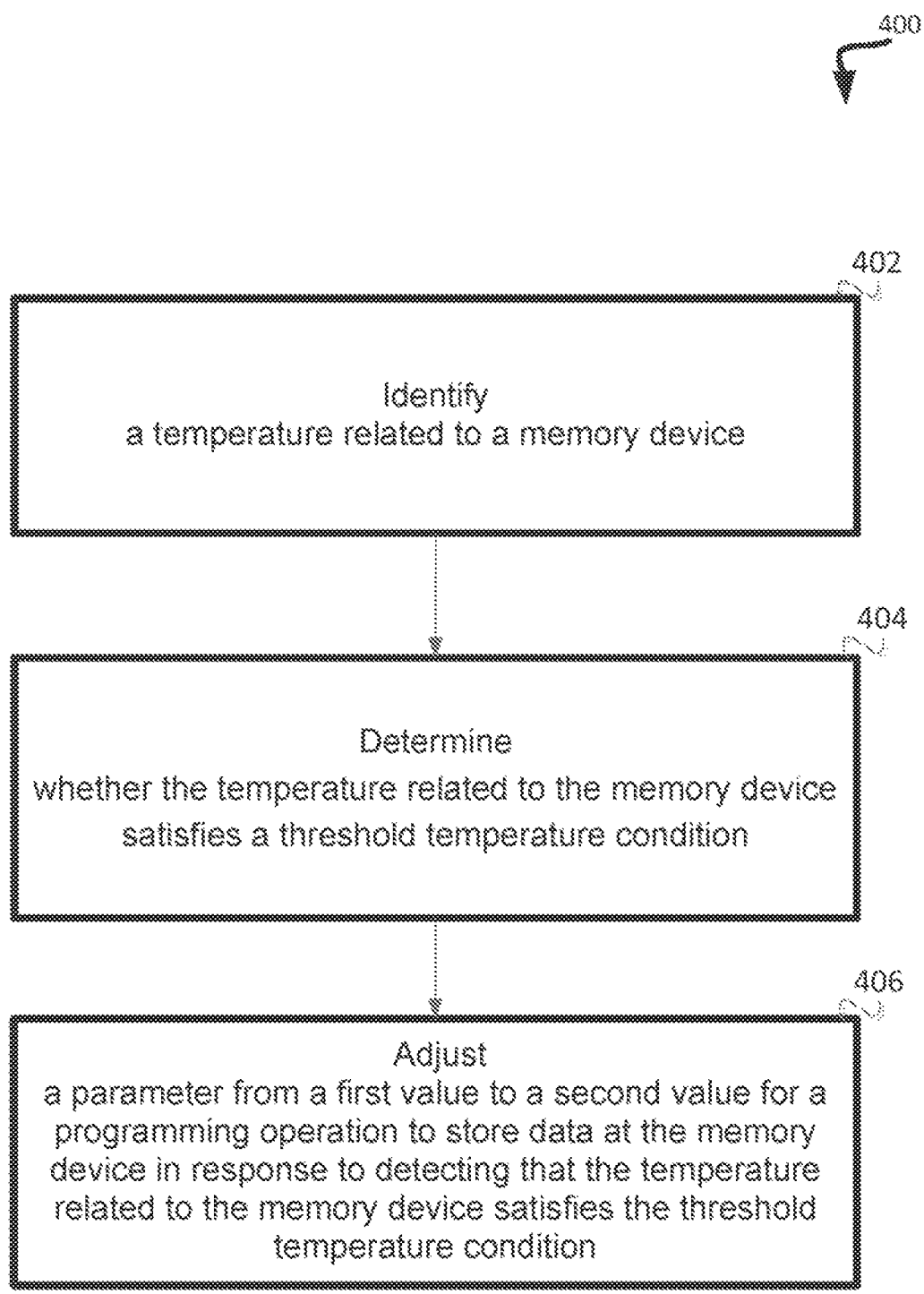
FIG. 4 is a flow diagram of an example method to adjust a parameter for a programming operation based on a temperature in accordance with some embodiments of the present disclosure.

FIG. 4 is a flow diagram of an example method 400 to adjust a write parameter based on a temperature in accordance with some embodiments of the present disclosure. Method 400 can be performed by processing logic that can include hardware (e.g., circuitry, dedicated logic, programmable logic, microcode, etc.), software (such as instructions run on a processing device), firmware, or a combination thereof. In one embodiment, the write parameter adjuster 113 of a processing device (e.g., controller 111) in FIG. 1 can perform method 400. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

At block 402, a processing device identifies a temperature related to a memory device. For example, the temperature can be current operating temperature for a storage system that includes the memory device. The temperature can be the current operating temperature for the storage system at a time when data is to be programmed to the memory device of the storage system.

At block 404, the processing device determines whether the temperature related to the memory device satisfies a threshold temperature condition. The temperature can satisfy the threshold temperature condition when the current operating temperature exceeds the threshold temperature condition or is below the temperature threshold condition. For example, the threshold temperature condition can specify a threshold temperature and the temperature related to the memory device can be considered to satisfy the threshold temperature condition when the temperature related to the memory device is equal to or lower than the threshold temperature. In some implementations, the temperature related to the memory device can be considered to satisfy the threshold temperature condition when the temperature related to the memory device is equal to or higher than the threshold temperature.

In some implementations, the processing device determines a difference between temperature and a second temperature related to programming data to the memory device. The second temperature is related to an initial or preferred operating temperature for the storage. The processing device can compare the two temperatures by determining a difference between the first temperature and the second temperature. The difference can indicate whether there is a shift in the operating temperature of the storage system. For example, the difference can indicate a decrease in temperature associated with the memory device and an increase in temperature associated with the memory device.

At block 406, the processing device adjusts a parameter from a first value to a second value for a programming operation to store data at the memory device in response to detecting that the temperature related to the memory device satisfies the threshold temperature condition. The parameter of the programming operation can be the programming step size to program the data at the memory device. For example, the programming step size at the first value may increase the voltage of each successive programming pulse that is to program the data by the first value. When the programming step size is adjusted to the second value, then the voltage of each successive programming pulse to program the data can be increased by the second value. In some implementations, temperature threshold condition can be represented by a series of temperature thresholds for adjusting the programming step size. For example, temperature thresholds include a first threshold that indicates a lower boundary to a first temperature range. This first temperature range can correspond to an "optimal" temperature range, such as typical room temperature. The temperature thresholds can also include a second threshold that can correspond to an "extreme" temperature range of temperatures that fall below a lowest temperature of the first temperature range.

Figure 5:
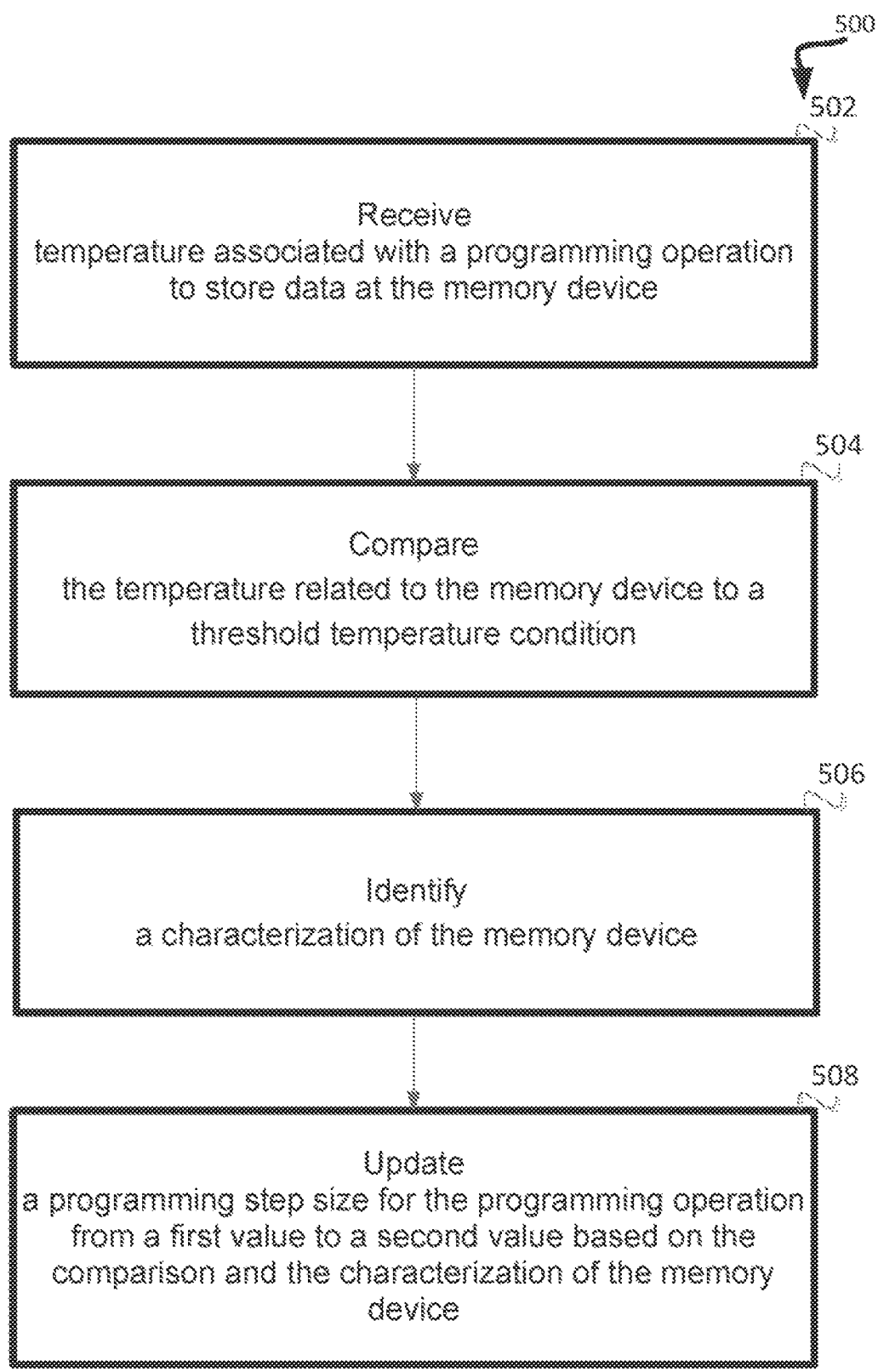
FIG. 5 is a flow diagram of an example method to update a parameter for a programming operation based on a temperature in accordance with some embodiments of the present disclosure.

FIG. 5 is a flow diagram of an example method 500 to update a parameter for a programming operation based on a temperature in accordance with some embodiments of the present disclosure. Method 500 can be performed by processing logic that can include hardware (e.g., circuitry, dedicated logic, programmable logic, microcode, etc.), software (such as instructions run on a processing device), firmware, or a combination thereof. In one embodiment, the write parameter adjuster 113 of a processing device (e.g., controller 111) in FIG. 1 can perform method 500. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

At block 502 a processing device receives a temperature associated with a programming operation to store data at the memory device. For example, the temperature can be received from one or more sensors associated with the memory device. The memory device can include multi-level cells (MLCs).

At block 504, the temperature is compared related to the memory device to a threshold temperature condition. For example, the processing device determines that the temperature related to the memory device satisfies the threshold temperature condition when the temperature is above or below a threshold temperature.

At block 506, the processing device can identify a characterization of the memory device. To characterize the memory device, the processing device can determine an error rate associated with the memory device. For example, the processing device can perform a read operation for data stored at the memory device to identity an error rate related to the memory device.

At block 508, a programming step size for the programming operation is updated from a first value to a second value based on the comparison and the characterization of the memory device. In this regards, the update to the programming step size from the first value to the second value is based on the error rate of the memory device satisfying a threshold error rate. If the error rate satisfies the error rate threshold, the processing device can provide the programming step size adjustments to the corresponding memory devices for use during a next programming operation.

Figure 6:
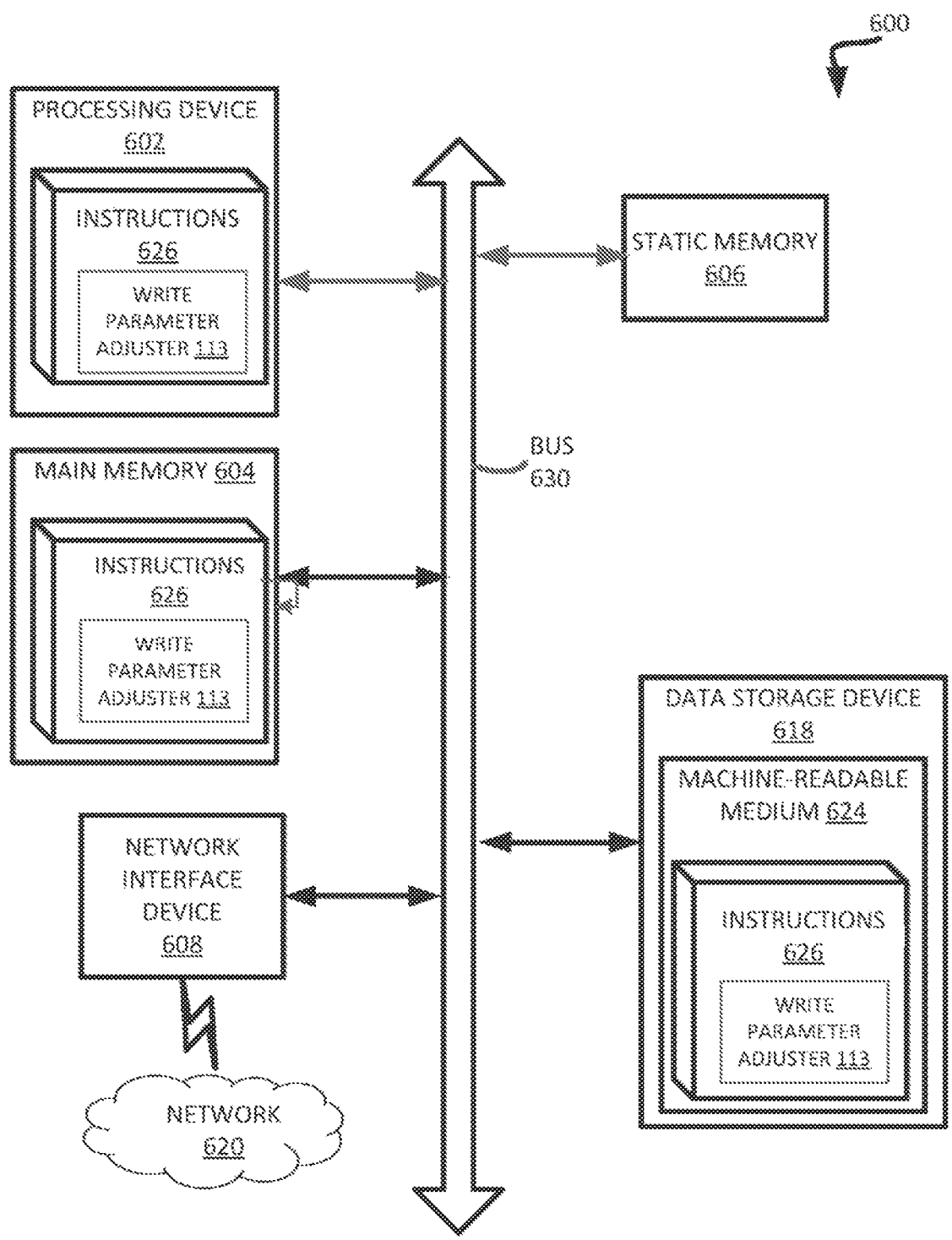
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. For example, the computer system 600 can correspond to a host system (e.g., the host system 120 of FIG. 1) that includes or utilizes a storage system (e.g., the storage system 110 of FIG. 1) or can be used to perform the operations of a controller (e.g., to execute an operating system to perform operations corresponding to the write parameter adjuster 113 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630. Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions or software 626 embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the storage system 110 of FIG. 1.

In one implementation, the instructions 626 include instructions to implement functionality corresponding to a write parameter adjuster (e.g., the write parameter adjuster 113 of FIG. 1). While the machine-readable storage medium 624 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD- ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A method comprising:
    identifying, by a processing device, a temperature related to a memory device of a plurality of memory devices;
    determining, whether the temperature related to the memory device satisfies a threshold temperature condition;
    responsive to detecting that the temperature related to the memory device satisfies the threshold temperature condition, identifying an entry associated with the memory device from a plurality of entries in a data structure, wherein each entry of the plurality of entries corresponds to one of the plurality of memory devices;
    determining a parameter value associated with the memory device from the identified entry in the data structure, wherein the parameter value is for applying an adjustment to a programming operation to store data at the memory device;
    updating a programming step size of the programming operation, using the parameter value, from a first value to a second value, wherein the programming step size indicates an increase in a voltage applied at the memory device to store data at the memory device; and
    storing data at the memory device during a subsequent programming operation using the second value of the programming step size of the programming operation.

2. The method of claim 1, wherein updating the programming step size further comprises adjusting a first voltage of a first programming pulse to a second voltage of the second programming pulse of the programming operation.

3. The method of claim 1, further comprising
    determining an error rate associated with the memory device,
    wherein adjusting the parameter value is based on the error rate of the memory device satisfying a threshold error rate.

4. The method of claim 1 further comprising:
    determining that the temperature related to the memory device satisfies the threshold temperature condition when the temperature is below a threshold temperature, wherein adjusting the parameter value corresponds to a decrease in a voltage step associated with the programming operation.

5. The method of claim 1 further comprising:
    determining that the temperature related to the memory device satisfies the threshold temperature condition when the temperature is above a threshold temperature, wherein adjusting the parameter value corresponds to an increase in a voltage step associated with the programming operation.

6. The method of claim 1, wherein the data structure comprises a table for storing data related to the plurality of the memory device.

7. A system comprising:
    a plurality of memory devices; and
    a processing device, operatively coupled with the plurality of memory devices, to perform operations comprising:
        identifying a temperature related to a memory device of the plurality of memory devices;
        determining, whether the temperature related to the memory device satisfies a threshold temperature condition;
        responsive to detecting that the temperature related to the memory device satisfies the threshold temperature condition, identifying an entry associated with the memory device from a plurality of entries in a data structure, wherein each entry of the plurality of entries corresponds to one of the plurality of memory devices;
        determining a parameter value associated with the memory device from the identified entry in the data structure, wherein the parameter value is for applying an adjustment to a programming operation to store data at the memory device;
        updating a programming step size of the programming operation, using the parameter value, from a first value to a second value, wherein the programming step size indicates an increase in a voltage applied at the memory device to store data at the memory device; and
        storing data at the memory device during a subsequent programming operation using the second value of the programming step size of the programming operation.

8. The system of claim 7, wherein updating the programming step size further comprises adjusting a first voltage of a first programming pulse to a second voltage of a second programming pulse of the programming operation.

9. The system of claim 7, wherein the processing device is to perform further operations comprising:
    determining that the temperature related to the memory device satisfies the threshold temperature condition when the temperature is below a threshold temperature, wherein adjusting the parameter value corresponds to a decrease in a voltage step associated with the programming operation.

10. The system of claim 7, wherein the processing device is to perform further operations comprising:
determining that the temperature related to the memory device satisfies the threshold temperature condition when the temperature is above a threshold temperature, wherein adjusting the parameter value corresponds to an increase in a voltage step associated with the programming operation.

11. The system of claim 7, wherein the data structure comprises a table for storing data related to the plurality of the memory device.

12. A non-transitory computer readable storage medium storing instructions, which when executed by a processing device, cause the processing device to perform operations comprising:
identifying a temperature related to a memory device of the plurality of memory devices;
determining, whether the temperature related to the memory device satisfies a threshold temperature condition;
responsive to detecting that the temperature related to the memory device satisfies the threshold temperature condition, identifying an entry associated with the memory device from a plurality of entries in a data structure, wherein each entry of the plurality of entries corresponds to one of the plurality of memory devices;
determining a parameter value associated with the memory device from the identified entry in the data structure, wherein the parameter value is for applying an adjustment to a programming operation to store data at the memory device;
updating a programming step size of the programming operation, using the parameter value, from a first value to a second value, wherein the programming step size indicates an increase in a voltage applied at the memory device to store data at the memory device; and
storing data at the memory device during a subsequent programming operation using the second value of the programming step size of the programming operation.

13. The non-transitory computer readable storage medium of claim 12, wherein the processing device is to perform further operations comprising:
determining that the temperature related to the memory device satisfies the threshold temperature condition when the temperature is below a threshold temperature, wherein adjusting the parameter value corresponds to a decrease in a voltage step associated with the programming operation.

14. The non-transitory computer readable storage medium of claim 12, wherein the processing device is to perform further operations comprising:
determining that the temperature related to the memory device satisfies the threshold temperature condition when the temperature is above a threshold temperature, wherein adjusting the parameter value corresponds to an increase in a voltage step associated with the programming operation.

15. The non-transitory computer readable storage medium of claim 12, wherein the processing device is to perform further operations comprising:
determining an error rate associated with the memory device,
wherein adjusting the parameter value is based on the error rate of the memory device satisfying a threshold error rate.

16. The non-transitory computer readable storage medium of claim 12, wherein adjusting of the parameter value associated with the memory device further comprises:
updating a programming step size of the programming operation from a first value to a second value, wherein the programming step size indicates an increase in a voltage applied at the memory device to store data at the memory device.

17. The non-transitory computer readable storage medium of claim 16, wherein updating the programming step size further comprises adjusting a first voltage of a first programming pulse to a second voltage of a second programming pulse of the programming operation.

18. The non-transitory computer readable storage medium of claim 12, wherein the memory device comprises a plurality of multi-level cells (MLCs).

* * * * *

UNITED STATES PATENT AND TRADEMARK OFFICE
CERTIFICATE OF CORRECTION

| | |
|---|---|
| PATENT NO. | : 11,429,309 B2 |
| APPLICATION NO. | : 16/930064 |
| DATED | : August 30, 2022 |
| INVENTOR(S) | : Mustafa N Kaynak et al. |

It is certified that error appears in the above-identified patent and that said Letters Patent is hereby corrected as shown below:

On the Title Page

Item [72], delete:
"Larry K Koudele"
Insert:
-- Larry J Koudele --

Signed and Sealed this
Fifteenth Day of November, 2022

Katherine Kelly Vidal
*Director of the United States Patent and Trademark Office*